(12) United States Patent
Kodani et al.

(10) Patent No.: US 11,888,036 B2
(45) Date of Patent: Jan. 30, 2024

(54) METHOD FOR SETTING A NITROGEN CONCENTRATION OF A SILICON EPITAXIAL FILM IN MANUFACTURING AN EPITAXIAL SILICON WAFER

(71) Applicant: SUMCO CORPORATION, Tokyo (JP)

(72) Inventors: Kazuya Kodani, Tokyo (JP); Toshiaki Ono, Tokyo (JP); Kazuhisa Torigoe, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 17/848,919

(22) Filed: Jun. 24, 2022

(65) Prior Publication Data

US 2022/0319851 A1    Oct. 6, 2022

Related U.S. Application Data

(62) Division of application No. 16/339,941, filed as application No. PCT/JP2017/032846 on Sep. 12, 2017, now abandoned.

(30) Foreign Application Priority Data

Oct. 7, 2016    (JP) .................................. 2016-198825

(51) Int. Cl.
*H01L 29/16* (2006.01)
*H01L 29/34* (2006.01)
*H01L 21/02* (2006.01)

(52) U.S. Cl.
CPC .............. *H01L 29/34* (2013.01); *H01L 29/16* (2013.01); *H01L 21/0257* (2013.01)

(58) Field of Classification Search
CPC ............. H01L 21/0262; H01L 21/3225; H01L 21/0257; H01L 27/14687; H01L 29/16
(Continued)

(56) References Cited

U.S. PATENT DOCUMENTS 5,854,117 A *  12/1998  Huisman ........... H01L 29/66174
                                                       257/E21.364
5,872,017 A *   2/1999  Boydston .......... H01L 21/02381
                                                       438/934

(Continued)

FOREIGN PATENT DOCUMENTS

CN        1725509 A    1/2006
EP    0 265 988 A1     5/1988
(Continued)

OTHER PUBLICATIONS

JP-2016111044-A Eng Machine Translation (Year: 2016).*
(Continued)

*Primary Examiner* — David Chen
(74) *Attorney, Agent, or Firm* — Greenblum & Bernstein, P.L.C.

(57) ABSTRACT

A manufacturing method of an epitaxial silicon wafer includes forming an epitaxial film made of silicon on a surface of a silicon wafer in a trichlorosilane gas atmosphere; and setting the nitrogen concentration of the surface of the epitaxial film through inward diffusion from a nitride film on the epitaxial film, the nitride film being formed by subjecting the silicon wafer provided with the epitaxial film to heat treatment in a nitrogen atmosphere.

5 Claims, 4 Drawing Sheets

(58) Field of Classification Search
USPC .......... 438/476, 506; 257/607, 655, E21.321
See application file for complete search history.

(56) References Cited

U.S. PATENT DOCUMENTS

| | | |
|---|---|---|
| 8,263,484 B2 | 9/2012 | Kurita |
| 9,502,266 B2 | 11/2016 | Ono et al. |
| 10,020,203 B1 | 7/2018 | Koike et al. |
| 2004/0126958 A1 | 7/2004 | Usuda et al. |
| 2007/0252239 A1 | 11/2007 | Maeda et al. |
| 2008/0053368 A1 | 3/2008 | Inami |
| 2008/0113171 A1 | 5/2008 | Nakai |
| 2010/0022066 A1* | 1/2010 | Aoki ............... H01L 21/76243 |
| | | 257/E21.563 |
| 2010/0096720 A1 | 4/2010 | Ohnuma et al. |
| 2010/0207207 A1 | 8/2010 | Tsai |
| 2010/0314670 A1 | 12/2010 | Denison |
| 2013/0341755 A1 | 12/2013 | Kokumai |
| 2014/0134779 A1 | 5/2014 | Kadono |
| 2014/0134780 A1* | 5/2014 | Kadono ............ H01L 21/02631 |
| | | 438/73 |
| 2014/0295171 A1 | 10/2014 | Hori |
| 2014/0353683 A1 | 12/2014 | Ishimabushi |
| 2015/0014706 A1 | 1/2015 | Sadwick |
| 2015/0228788 A1 | 8/2015 | Chen |
| 2015/0303071 A1 | 10/2015 | Storck |
| 2015/0318384 A1 | 11/2015 | Boeck |
| 2016/0064553 A1 | 3/2016 | Furuhata |
| 2016/0186360 A1* | 6/2016 | Hirose ............. H01L 21/02381 |
| | | 117/101 |

FOREIGN PATENT DOCUMENTS

| | | |
|---|---|---|
| JP | 2000-323689 A | 11/2000 |
| JP | 2004-356164 A | 12/2004 |
| JP | 2006-13119 A | 1/2006 |
| JP | 2006-086179 A | 3/2006 |
| JP | 2007-073594 A | 3/2007 |
| JP | 2007-073820 A | 3/2007 |
| JP | 2009-105427 A | 5/2009 |
| JP | 2009-252920 A | 10/2009 |
| JP | 2010-123931 A | 6/2010 |
| JP | 2013-070091 A | 4/2013 |
| JP | 2013-118388 A | 6/2013 |
| JP | 2013-184860 A | 9/2013 |
| JP | 2016111044 A * | 6/2016 |
| KR | 10-2015-0066590 A | 6/2015 |
| WO | WO 2005/104208 A1 | 3/2005 |

OTHER PUBLICATIONS

ISR for PCT/JP2017/032846, dated Oct. 10, 2017 (w/ translation).
IPRP for PCT/JP2017/032846, dated Apr. 9, 2019 (w/ translation).
Office Action for JP App. No. 2016-198825, dated Aug. 14, 2017 (w/ translation).
Notice of Allowance for KR App. No. 10-2019-7011274, dated Sep. 23, 2020 (w/ partial translation).
Office Action for DE App. No. 112017005106.1, dated Dec. 14, 2020 (w/ translation).
Wang et al., "High temperature nitrogen annealing induced interstitial oxygen precipitation in silicon epitaxial layer on heavily arsenic-doped silicon wafer", Appl. Phys. Lett., 88:242112-1-242112-3 (2006).
Office Action for CN App. No. 201780061762.4, dated Sep. 28, 2022 (w/ translation).

* cited by examiner

METHOD FOR SETTING A NITROGEN CONCENTRATION OF A SILICON EPITAXIAL FILM IN MANUFACTURING AN EPITAXIAL SILICON WAFER

This is a division of U.S. application Ser. No. 16/339,941, which is the U.S. national stage of PCT/JP2017/032846, filed Sept. 12, 2017, which claims priority to JP 2016-198825, filed Oct. 7, 2016. The disclosure of each of the above applications is herein incorporated by reference in its entirety.

TECHNICAL FIELD

The present invention relates to an epitaxial silicon wafer and a manufacturing method of the epitaxial silicon wafer.

BACKGROUND ART

In order to enhance performance of silicon devices, which have been increasingly microfabricated, strain is sometimes applied on or near a surface (device active layer) of a wafer.

Examples of such a wafer as proposed include a strained silicon wafer including an SiGe layer epitaxially grown on a monocrystalline silicon substrate and a strained Si layer epitaxially grown on the SiGe layer, a wafer whose surface is nitrided instead of forming the SiGe layer, and an SOI wafer.

Tensile strain is caused in the above strained Si layer due to the SiGe layer having a larger lattice constant than that of Si. The tensile strain changes the band structure of Si to remove degeneracy, thereby enhancing carrier mobility. Accordingly, the use of the strained Si layer as a channel region allows for the carrier mobility to be 1.5 times or more as fast as that in a semiconductor substrate made of an ordinary bulk silicon. The strained silicon wafer is thus suitable for high-speed MOSFET, MODFET, HEMT and the like.

However, since a very large film stress is caused by the strain applied on or near the surface of the strained silicon wafer, dislocations sometimes occur due to the strain toward the surface of the wafer. In view of the above, studies have been made on a method for reducing the dislocations (see, for instance, Patent Literature 1).

In the method disclosed in Patent Literature 1, heat treatment for setting oxygen concentration is conducted after epitaxial growth to enhance strength of the epitaxial film by increasing an oxygen concentration of the surface of the epitaxial film through outward diffusion from bulk silicon and inward diffusion from the oxide film on the surface.

CITATION LIST

Patent Literature(s)

Patent Literature 1: JP 2013-70091 A

SUMMARY OF THE INVENTION

Problem(s) To Be Solved By The Invention

However, in view of an increase in stress applied on an epitaxial film due to recent use of a three-dimensional device structure, sufficient strength cannot necessarily be obtained by increasing oxygen concentration as disclosed in Patent Literature 1.

An object of the invention is to provide an epitaxial silicon wafer capable of reducing occurrence of dislocations, and a manufacturing method of the epitaxial silicon wafer.

Means For Solving The Problem(s)

As a result of intensive studies, the inventors of the invention have found that the occurrence of dislocations can be inhibited by increasing nitrogen concentration of a surface of an epitaxial film irrespective of film stress caused by the formation of the strain layer. The reason for the above is speculated as follow.

It is speculated that film stress, which is caused when a strain layer is formed on an epitaxial film, initially causes small dislocations at an interface between the strain layer and the epitaxial film, and then the small dislocations extends into the epitaxial film. It is speculated that, with the increased nitrogen concentration in the epitaxial film, nitrogen locks to the small dislocations at the interface, thereby inhibiting the extension of the dislocations toward into the epitaxial film.

The invention has been made based on the above findings.

An epitaxial silicon wafer according to an aspect of the invention includes: a silicon wafer; and an epitaxial film made of silicon and formed on a surface of the silicon wafer, in which a nitrogen concentration of the surface of the epitaxial film is $5.0 \times 10^{13}$ atoms/cm$^3$ or more.

According to the above aspect of the invention, an epitaxial silicon wafer capable of reducing occurrence of dislocations irrespective of the presence of a strain layer on an epitaxial film can be provided.

It should be noted that the nitrogen concentration of the surface of the epitaxial film according to the aspect of the invention refers to nitrogen concentration in a depth profile measured using an SIMS (Secondary Ion Mass Spectrometer) at a depth ranging from 80 nm to 200 nm, preferably at a depth of 100 nm. The nitrogen concentration is so defined as above to exclude the nitrogen concentration of the topmost surface of the silicon wafer, which cannot be correctly measured by an SIMS due to influence of sample contamination, and to correctly determine the influence of inward diffusion.

In the epitaxial silicon wafer according to the above aspect of the invention, it is preferable that the nitrogen concentration at a depth of 3 μm from the surface of the epitaxial film is $5.0 \times 10^{13}$ atoms/cm$^3$ or more.

According to the above arrangement, even when the nitrogen concentration of the surface of the epitaxial film is decreased by a heat treatment during a device process, the nitrogen concentration at the above depth can be kept at a level capable of reducing the occurrence of dislocations.

The epitaxial silicon wafer according to the above aspect of the invention preferably further include: a strain layer provided on the surface of the epitaxial film, the strain layer causing a film stress ranging from 10 MPa to 1000 MPa.

According to the above arrangement, an epitaxial silicon wafer capable of accelerating carrier mobility and reducing the occurrence of dislocations can be provided.

In the epitaxial silicon wafer according to the above aspect of the invention, it is preferable that an oxygen concentration of the silicon wafer ranges from $10 \times 10^{17}$ atoms/cm$^3$ to $15 \times 10^{17}$ atoms/cm$^3$ according to ASTM 1979.

When the oxygen concentration in the silicon wafer is less than $10 \times 10^{17}$ atoms/cm$^3$, the strength of the epitaxial film may become insufficient. Meanwhile, when the oxygen concentration in the silicon wafer exceeds $15 \times 10^{17}$ atoms/$cm^3$, defects due to oxygen may be generated in the epitaxial film.

The above deficiencies can be restrained by the above arrangement.

A manufacturing method of an epitaxial silicon wafer according to another aspect of the invention includes: forming an epitaxial film made of silicon on a surface of a silicon wafer in a trichlorosilane gas atmosphere; and setting a nitrogen concentration of the surface of the epitaxial film through inward diffusion from a nitride film on the epitaxial film, the nitride film being formed by subjecting the silicon wafer provided with the epitaxial film through the forming of the epitaxial film to a heat treatment in a nitrogen atmosphere.

An epitaxial film may be formed on a silicon wafer whose nitrogen concentration is increased, and outward diffusion from the silicon wafer may be used in order to increase the nitrogen concentration of the surface of the epitaxial film, for instance. However, since the diffusion rate of nitrogen is relatively fast, the outwardly diffusing nitrogen in the above method is released to the outside through the epitaxial film, failing to sufficiently increasing the nitrogen concentration of the surface of the epitaxial film.

In contrast, since the inward diffusion from the nitride film formed on the epitaxial film is used in the above aspect of the invention, the nitrogen concentration of the surface of the epitaxial film can be increased to a level capable of reducing the occurrence of the dislocations even when a strain layer is formed.

The manufacturing method of an epitaxial silicon wafer according to the above aspect of the invention preferably further include: removing a native oxide on the surface of the epitaxial film before the nitride film is formed, in which the setting of the nitrogen concentration is conducted on the silicon wafer after removing the native oxide.

For instance, when the epitaxial film is exposed to an oxygen-containing atmosphere in transferring the epitaxial silicon wafer to heat treatment equipment for forming a nitride film, native oxide is formed on the surface of the epitaxial film. The native oxide present on the surface of the epitaxial film may inhibit the inward diffusion of nitrogen to the epitaxial film.

According to the above arrangement, the native oxide on the surface of the epitaxial film is removed before the nitride film is formed to promote the inward diffusion of nitrogen to the epitaxial film.

In the manufacturing method of an epitaxial silicon wafer according to the above aspect of the invention, it is preferable that the native oxide is removed by subjecting the silicon wafer to a heat treatment in one of an argon atmosphere, an ammonia atmosphere, and a hydrogen atmosphere by using the same heat treatment equipment as used in the setting of the nitrogen concentration.

According to the above arrangement, the nitride film can be formed without exposing the epitaxial film to an oxygen atmosphere simply by changing the atmosphere in the heat treatment equipment after removing the native oxide.

The manufacturing method of an epitaxial silicon wafer according to the above aspect of the invention preferably further includes: entirely removing the nitride film.

The nitride film, which is useful for the adjustment of nitrogen concentration in the epitaxial film, needs to be removed before fabrication of devices.

The removal process of the nitride film in a device manufacturer can be omitted according to the above arrangement. Further, the above arrangement allows an epitaxial silicon wafer manufacturer to inspect the surface of the epitaxial film, so that quality guaranteed products can be delivered to device manufacturers.

The manufacturing method of an epitaxial silicon wafer according to the above aspect of the invention preferably further includes: forming a strain layer on the surface of the epitaxial film exposed after the removing of the nitride film, the strain layer causing a film stress ranging from 10 MPa to 1000 MPa.

In the manufacturing method of an epitaxial silicon wafer according to the above aspect of the invention, it is preferable that, in the setting of the nitrogen concentration, the heat treatment is conducted so that a temperature X (degrees C.) is in a range from 850 degrees C. to 1400 degrees C., a heat treatment time Y (seconds) is 1 second or more and a formula (1), $$Y \geq 1 \times 10^{34} \exp(-0.084X) \tag{1}$$

is satisfied.

According to the above arrangement, the nitrogen concentration of the surface of the epitaxial film can be increased to a level capable of reducing the occurrence of dislocations irrespective of the presence of the strain layer simply by referring to the above formula (1).

BRIEF DESCRIPTION OF DRAWING(S)

DESCRIPTION OF EMBODIMENT(S)

An Exemplary embodiment of the invention will be described below with reference to the attached drawings.

Structure of Epitaxial Silicon Wafer

Figure 1:
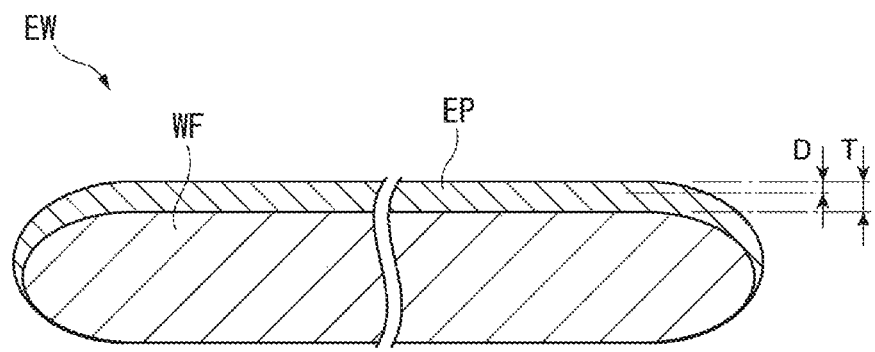
FIG. 1 is a cross section showing an epitaxial silicon wafer according to an exemplary embodiment of the invention.

As shown in FIG. 1, an epitaxial silicon wafer EW includes a silicon wafer WF, and an epitaxial film EP provided on a surface of the silicon wafer WF.

A film thickness T of the epitaxial film EP is preferably in a range from 0.1 µm to 20 µm. The film thickness is preferably 0.1 µm or more because STI (Shallow Trench Isolation) structure is usually formed at a depth of 0.1 µm or more from the surface of the epitaxial film EP. Further, the film thickness of 20 µm or less is preferable because, when the film thickness exceeds 20 µm, warpage caused by crystal lattice mismatch between the silicon wafer WF and the epitaxial film EP exerts large influence on the film stress at the surface, whereby it is possible that the effect in reducing the occurrence of dislocations by inward diffusion of nitrogen is impaired. It should be noted that the film thickness T is further preferably more than 3 µm and 10 µm or less.

The nitrogen concentration of the surface of the epitaxial film EP is preferably in a range from $5.0 \times 10^{13}$ atoms/$cm^3$ to $5.0 \times 10^{15}$ atoms/$cm^3$, more preferably in a range from $1 \times 10^{14}$ atoms/$cm^3$ to $3 \times 10^{15}$ atoms/$cm^3$. It is preferable that nitrogen is introduced at or below solid solubility limit of silicon crystal. However, in view of the possibility of generating defects in the epitaxial film EP derived from nitrogen due to long-duration heat treatment in the device process, the above concentration range is preferable. The nitrogen concentration is preferably measured at a depth D of 80 nm to 200 nm from the surface, more preferably at the depth D of 100 nm.

The nitrogen concentration measured at the depth D of 3 μm from the surface of the epitaxial film EP is preferably $5.0 \times 10^{13}$ atoms/cm$^3$ or more. The point at the depth D of 3 μm is within the epitaxial film EP when the film thickness T of the epitaxial film EP exceeds 3 μm, and within the silicon wafer WF when the film thickness T is 3 μm or less.

With the nitrogen concentration of $5.0 \times 10^{13}$ atoms/cm$^3$ or more at the point of the depth D of 3 μm (irrespective of whether the point is within the silicon wafer WF), even when nitrogen in the surface of the epitaxial film EP is released through outward diffusion by the heat treatment during the device process or the like, nitrogen is fed to the surface of the epitaxial film EP from the depth D of 3 μm, thereby reducing dislocations.

Oxygen concentration of the silicon wafer WF is preferably in a range from $10 \times 10^{17}$ atoms/cm$^3$ to $15 \times 10^{17}$ atoms/cm$^3$ (ASTM1979). With the oxygen concentration being set within the above range, the sufficient strength of the epitaxial film EP can be ensured and defects due to oxygen can be reduced on the epitaxial film EP.

Manufacturing Method of Epitaxial Silicon Wafer

Figure 2:
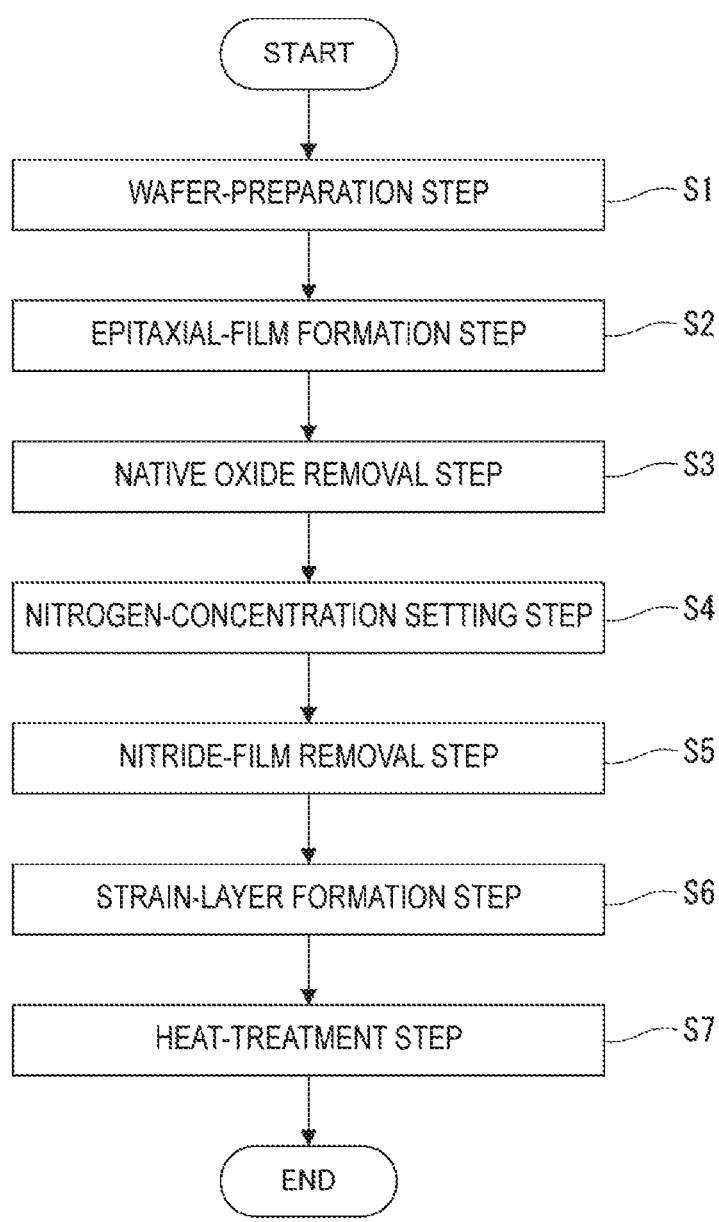
FIG. 2 is a flowchart showing a manufacturing method of the epitaxial silicon wafer.

As shown in FIG. 2, a manufacturing method of the epitaxial silicon wafer EW having the above properties includes wafer-preparation step S1, epitaxial-film formation step S2, native oxide removal step S3, nitrogen-concentration setting step S4, nitride-film removal step S5, strain-layer formation step S6, and heat-treatment step S7.

It should be noted that at least one of the native oxide removal step S3, the nitride-film removal step S5, the strain-layer formation step S6, and the heat-treatment step S7 may be omitted.

In the wafer-preparation step S1, a silicon single crystal ingot pulled up by CZ (Czochralski) method, MCZ (Magnetic-field-applied Czochralski) method or the like is subjected to necessary steps selected from slicing, chamfering, grinding, lapping, etching, polishing, washing, heat treatment such as DK (Donor Killer) treatment, and the like to be formed into the silicon wafer WF having a mirror-polished surface.

In the epitaxial-film formation step S2, the epitaxial film EP having a predetermined film thickness T is formed on the silicon wafer WF to provide the epitaxial silicon wafer EW. At this time, the epitaxial film is formed in a gas atmosphere (e.g. trichlorosilane) at a treatment temperature ranging from 1150 to 1280 degrees C. It should be noted that necessary dopant(s) such as boron and phosphorus may be added.

In the native oxide removal step S3, a native oxide formed on the epitaxial film EP is removed. The removal of the native oxide during the native oxide removal step S3 may be conducted by, for instance, loading the epitaxial silicon wafer EW in heat treatment equipment, which is to be used in the nitrogen-concentration setting step S4, and subjecting the epitaxial silicon wafer EW to a heat treatment in an atmosphere of one of argon atmosphere, ammonia atmosphere and hydrogen atmosphere.

The heat treatment temperature is preferably in a range from 1000 to 1350 degrees C. in any of the argon atmosphere, ammonia atmosphere, hydrogen atmosphere, or a mixture atmosphere of combination of at least two of the argon atmosphere, ammonia atmosphere, and hydrogen atmosphere. When the temperature is lower than 1000 degrees C., it is possible that the native oxide is not completely removed. Meanwhile, the upper limit is 1350 degrees C. in view of the performance limitations of the heat treatment equipment. The heat treatment time is preferably in a range from 1 second to 60 seconds. In order to completely remove the native oxide, the epitaxial silicon wafer is preferably subjected to heat treatment of 1 or more seconds. Further, the heat treatment time is preferably as short as possible in view of productivity. When the heat treatment temperature is in a range from 1000 to 1350 degrees C., it is believed that the native oxide can be sufficiently removed by a heat treatment of 60 seconds or less.

In the nitrogen-concentration setting step S4, the epitaxial silicon wafer EW, from which the native oxide is removed, is subjected to a heat treatment in a nitrogen atmosphere to form a nitride film on the epitaxial film EP and the nitrogen concentration of the surface of the epitaxial film EP is set through inward diffusion from the nitride film. At this time, the nitrogen concentration in the silicon wafer WF is set as well as the nitrogen concentration on and inside of the surface of the epitaxial film EP.

In the nitrogen-concentration setting step S4, it is preferable that the heat treatment is conducted such that the temperature X (degrees C.) is in a range from 850 degrees C. to 1400 degrees C., and the heat treatment time Y (seconds) is 1 second or more and satisfies the following formula (1).

$$Y \geq 1 \times 10^{34} \exp(-0.084X) \quad (1)$$

The heat treatment may be conducted in any manner (e.g. batch process using a vertical furnace, rapid heating/cooling heat treatment using a single wafer processing furnace, and the like) as long as the nitrogen concentration of the epitaxial film EP can be set in the above-described range. The atmosphere gas for the heat treatment may consist of ammonia or may be a mixture gas of argon and ammonia. The heat treatment equipment used for the nitrogen-concentration setting step S4 is preferably the same heat treatment equipment as used in the native oxide removal step S3, since the nitride film can be formed only by changing the atmosphere in the heat treatment equipment after removing the native oxide.

In the nitride-film removal step S5, the nitride film used for the setting of the nitrogen concentration of the epitaxial film EP is entirely removed. In the nitride-film removal step S5, a part of the epitaxial film EP near the surface thereof may be removed together with the nitride film. At this time, the nitrogen concentration of the surface of the epitaxial film EP after the removal of the nitride film (and the part of the surface of the epitaxial film EP) needs to be kept at a level capable of reducing the occurrence of dislocations when a strain layer is formed. The nitride film is exemplarily removed by polishing and/or etching.

In the strain-layer formation step S6, the strain layer causing a film stress ranging from 10 MPa to 1000 MPa is formed on the surface of the epitaxial film EP exposed after the nitride-film removal step S5.

Figure 3:
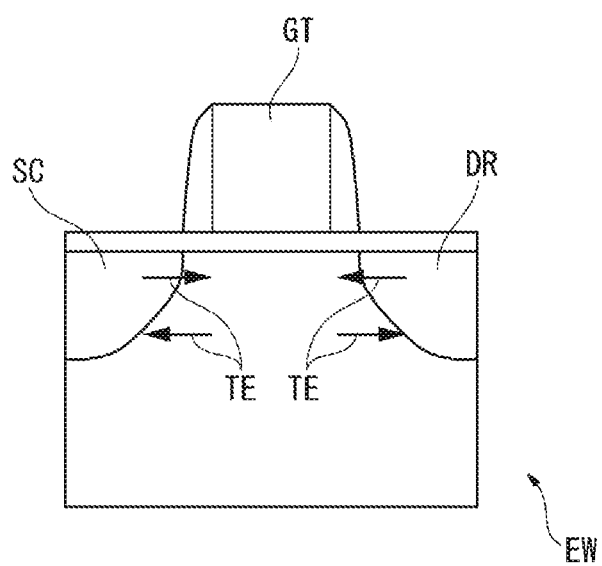
FIG. 3 illustrates an example of a semiconductor substrate, on which a strain layer is formed in a device process experienced by the epitaxial silicon wafer.

The strain layer is partially formed on the surface of the epitaxial film EP to form a part of devices. Specifically, as shown in FIG. 3, the strain layer is SiGe film, SiC film or the like, which causes film stress in a plane direction (shown by arrows TE) of the surface of the epitaxial film EP and forms a source region SC and a drain region DR at a part except for a part immediately below a gate region GT. The strain layer as shown in FIG. 3 is not exhaustive, but may be in any form and may be formed in any manner as long as the film stress is caused.

It should be noted that the epitaxial silicon wafer EW of the exemplary embodiment is subjected to the device process, a part of which may be the strain-layer formation step S6.

The heat-treatment step S7 is performed, for instance, under the same conditions as the heat treatment in the device process. Since the nitrogen concentration of the surface of the epitaxial film EP is set within the above range, the occurrence of dislocations can be reduced even when a film stress ranging from 10 MPa to 1000 MPa is caused by the strain layer in the heat-treatment step S7.

Advantages of Exemplary Embodiment(s)

As described above, since the nitrogen concentration of the surface of the epitaxial film EP of the epitaxial silicon wafer EW is set at $5.0 \times 10^{13}$ atoms/cm$^3$ or more, the occurrence of the dislocations can be reduced even when the strain layer is formed on the epitaxial film EP.

Further, since the inward diffusion from the nitride film formed on the epitaxial film EP is used in order to set the nitrogen concentration of the epitaxial silicon wafer EW, the nitrogen concentration of the surface of the epitaxial film EP can be increased to a level capable of reducing the occurrence of the dislocations in the manufacturing method of the invention.

EXAMPLES

Next, the invention will be described in more detail below with reference to Examples. However, it should be noted that the scope of the invention is by no means limited by these Examples.

Manufacturing Method of Samples

Experimental Example 1

A 2-μm thick epitaxial film was grown on a silicon wafer, which was mirror-polished after being cut from a 300-mm silicon single crystal grown by Czochralski (CZ) method, at a temperature of approximately 1100 degrees C.

Subsequently, as shown in Table 1, the silicon wafer was subjected to the native oxide removal step, as necessary, and the heat treatment (nitrogen-concentration setting step) in a nitrogen atmosphere under conditions shown in Table 1. The silicon wafer was subjected to the treatment in an RTA (Rapid Thermal Annealing) furnace when the treatment time was 180 seconds or less, or to the treatment in a vertical furnace when the treatment time was more than 180 seconds. After the heat treatment, the formed nitride film was entirely removed to provide the epitaxial silicon wafers according to Experimental Example 1 under 25 conditions shown in Table 1.

It should be noted that heat treatment equipment used in the nitrogen-concentration setting step was also used in the native oxide removal step to apply a heat treatment for 60 seconds in a hydrogen atmosphere of 1000 degrees C.

Experimental Examples 2, 3

Epitaxial silicon wafers according to Experimental Example 2 were obtained under 25 conditions shown in Table 1 in the same process as in Experimental Example 1 except that the epitaxial film was grown to be 4-μm thick.

Epitaxial silicon wafers according to Experimental Example 3 were obtained under 25 conditions shown in Table 1 in the same process as in Experimental Example 1 except that the epitaxial film was grown to be 6-μm thick.

TABLE 1

| Conditions | Nitrogen-concentration setting step Temperature X (degrees C.) | Time Y(sec.) | Native oxide removal step | Nitrogen concentration at 3 μm depth (atoms/cm$^{-3}$) | Result of three-point bending test |
|---|---|---|---|---|---|
| 1 | 800 | 3600 | Yes | <LOD (limit of detection) | NG |
| 2 | 800 | 10800 | Yes | <LOD | NG |
| 3 | 850 | 12 | Yes | <LOD | NG |
| 4 | 850 | 120 | Yes | <LOD | NG |
| 5 | 850 | 300 | Yes | <LOD | NG |
| 6 | 850 | 600 | Yes | <LOD | NG |
| 7 | 850 | 1200 | No | <LOD | NG |
| 8 | 850 | 1200 | Yes | $5.1 \times 10^{13}$ | OK |
| 9 | 850 | 3600 | Yes | $5.5 \times 10^{13}$ | OK |
| 10 | 850 | 10800 | Yes | $5.8 \times 10^{13}$ | OK |
| 11 | 900 | 6 | Yes | <LOD | NG |
| 12 | 900 | 18 | No | <LOD | NG |
| 13 | 900 | 18 | Yes | $5.0 \times 10^{13}$ | OK |
| 14 | 900 | 180 | No | <LOD | NG |
| 15 | 900 | 180 | Yes | $1.1 \times 10^{14}$ | OK |
| 16 | 900 | 1200 | Yes | $1.3 \times 10^{14}$ | OK |
| 17 | 950 | 6 | No | <LOD | NG |
| 18 | 950 | 6 | Yes | $1.2 \times 10^{14}$ | OK |
| 19 | 950 | 60 | Yes | $2.5 \times 10^{14}$ | OK |
| 20 | 1000 | 6 | No | <LOD | NG |
| 21 | 1000 | 6 | Yes | $3.9 \times 10^{14}$ | OK |
| 22 | 1000 | 18 | Yes | $5.0 \times 10^{14}$ | OK |
| 23 | 1100 | 6 | No | <LOD | NG |
| 24 | 1100 | 6 | Yes | $1.5 \times 10^{15}$ | OK |
| 25 | 1200 | 6 | Yes | $3.0 \times 10^{15}$ | OK |

Evaluation

Nitrogen Concentration of Epitaxial Silicon Wafer

The nitrogen concentration of the top layer of the epitaxial film of the epitaxial silicon wafer prepared through the process of Experimental Examples 1, 2, 3 (specifically, the concentration at the depth of 3 μm from the surface of the epitaxial film) was measured using an SIMS.

The measurements were the same as in Experimental Examples 1, 2, 3. The results are shown in Table 1.

It should be noted that, since the thickness of the epitaxial film in Experimental Example 1 was 2 μm, the results in Table 1 show the nitrogen concentration in the silicon wafer. Since the thicknesses of the epitaxial films in Experimental Examples 2, 3 were 4 μm and 6 μm, respectively, the results in Table 1 show the nitrogen concentration in the epitaxial film. The lower limit of detection was $5.0 \times 10^{13}$ atoms/cm$^3$.

As shown in Table 1, the nitrogen concentrations under the conditions 7, 12, 14, 17, 20 and 23, in which the native oxide removal step was not conducted, were less than the lower limit of detection. In contrast, all of the nitrogen concentrations under conditions 8, 13, 15, 18, 21 and 24, in which the nitrogen-concentration setting step under the same conditions as in the conditions 7, 12, 14, 17, 20 and 23 and the native oxide removal step were conducted, were the lower limit of detection or more.

Accordingly, it has been demonstrated that the native oxide removal step before the nitrogen-concentration setting step promotes the inward diffusion of nitrogen into the epitaxial film to increase the nitrogen concentration to a desired level.

It can be assumed that the samples with the nitrogen concentration of the lower limit of detection or more in Table 1 have the nitrogen concentration of the lower limit of detection or more in the surface of the epitaxial film. The reason for the above is as follows.

With the use of outward diffusion from the silicon wafer, the nitrogen concentration becomes lower toward the surface of the epitaxial silicon wafer. However, in Experimental Examples, with the use of inward diffusion from the nitride film formed on the surface of the epitaxial silicon wafer, the nitrogen concentration becomes higher toward the top layer.

Effect in Reducing Occurrence of Dislocations in Epitaxial Silicon Wafer

Stress-applying test was conducted on the epitaxial silicon wafers according to Experimental Example 2.

Initially, a measurement sample of 3-cm length and 1.5-cm width was cut out from each of epitaxial silicon wafers. Next, a linear impression with 100-nm depth, 50-μm width and 1-mm length was formed on the surface of each measurement sample (i.e. on the surface of the epitaxial film). Then, a three-point bending test was conducted on each measurement sample with a distance between supports being 2 cm at a test temperature of 800 degrees C. At this time, 2N load was applied so that tensile stress acts on the surface of the measurement sample.

Subsequently, each measurement sample having been cooled to the ambient temperature was light-etched by approximately 1 μm to check the presence of dislocation pits generated from the linear impression using an optical microscope.

The results are shown in Table 1. It should be noted that "NG" indicates that the dislocation pits were detected and "OK" indicates that the dislocation pits were not detected.

As shown in Table 1, the dislocation pits were detected in all the samples with the nitrogen concentration of less than the lower limit of detection at the depth of 3 μm from the surface of the epitaxial film. In contrast, the dislocation pits were not detected in all the samples with the nitrogen concentration of the epitaxial film having the lower limit of detection or more at the depth of 3 μm from the surface.

This is speculated to be because a high nitrogen concentration increases critical stress for the occurrence of dislocations and, consequently, reduces the occurrence of dislocations, which is caused at the linear impression formed on the surface of the silicon wafer as a result of concentration of the stress applied in the three-point bending test. It is also supposed that the same results are obtained in Examples 1, 3 because of the same nitrogen concentration.

From the above, it has been demonstrated that the nitrogen concentration of $5.0\times10^{13}$ atoms/cm$^3$ or more measured at the depth of 3 μm from the surface of the epitaxial film can reduce the occurrence of dislocations.

Further, it is speculated that the above range of the nitrogen concentration at the depth of 3 μm allows nitrogen to be supplied from the 3-μm depth to the surface of the epitaxial film even when nitrogen in the surface of the epitaxial film is released through outward diffusion due to the heat treatment during the device process or the like, resulting in the reduction of the occurrence of dislocations.

Figure 4:
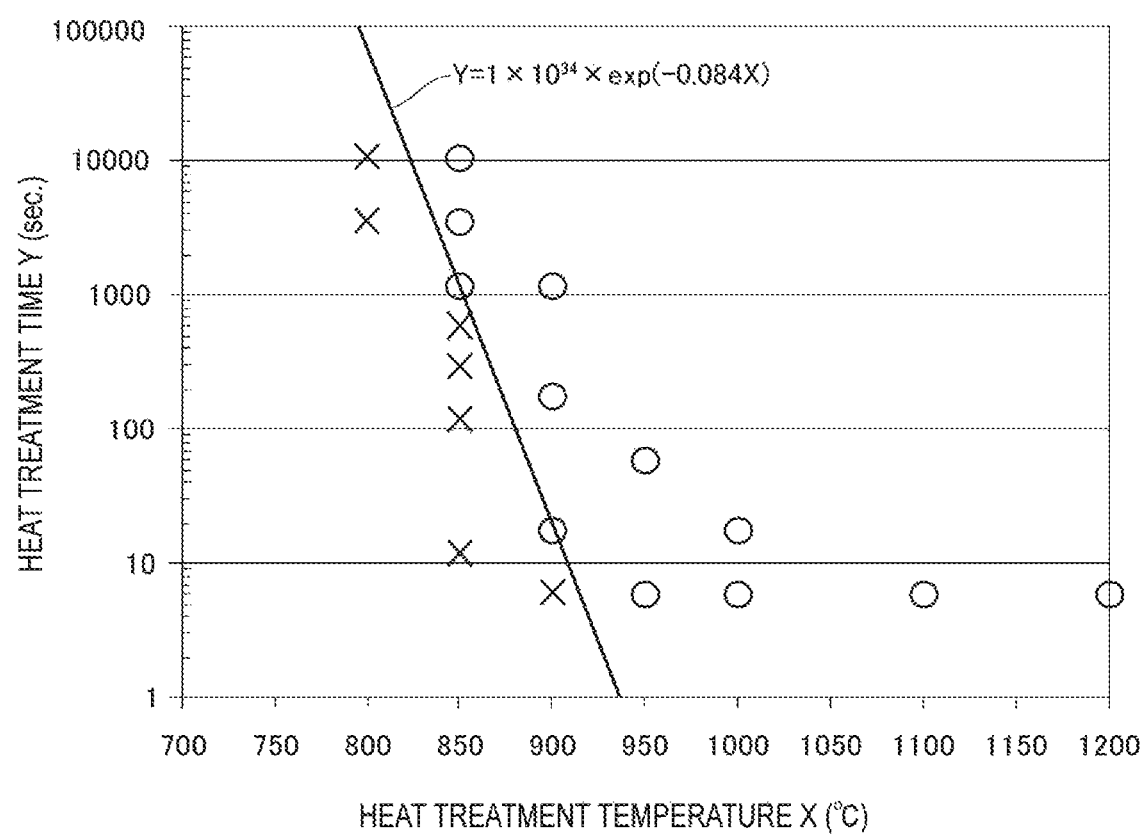
FIG. 4 is a graph showing a relationship between a temperature and time of a heat treatment in a nitrogen-concentration setting step, and occurrence of dislocations according to Examples of the invention.

Mathematical Formulation of Heat Treatment Conditions in Nitrogen Concentration Setting Step The relationship between temperature X and time Y of the heat treatment during the nitrogen-concentration setting step is plotted in a graph shown in FIG. 4 for the conditions other than 7, 12, 14, 17, 20, and 23 in Table 1, in which the native oxide removal step is not conducted. In the graph, the result "NG" of the three-point bending test is plotted in "x", whereas the result "OK" is plotted in "o."

The border between "OK" and "NG" is approximated by a linear line represented by a formula (2) below, where the left and right sides with respect to the linear line are "NG" region and "OK" region, respectively.

$$Y=1\times10^{34}\exp(-0.084X) \qquad (2)$$

As a result, it has been found that the heat treatment during the nitrogen-concentration setting step, which satisfies the above formula (1), allows the nitrogen concentration at the depth of 3 μm from the surface of the epitaxial film to be $5.0\times10^{13}$ atoms/cm$^3$ or more.

The invention claimed is:

1. A manufacturing method of an epitaxial silicon wafer, the method comprising:
    forming an epitaxial film made of silicon on a surface of a silicon wafer in a trichlorosilane gas atmosphere;
    setting a nitrogen concentration at a depth ranging from 80 nm to 200 nm from a surface of the epitaxial film through inward diffusion from a nitride film on the epitaxial film, the nitride film being formed by subjecting the silicon wafer provided with the epitaxial film through the forming of the epitaxial film to a heat treatment in a nitrogen atmosphere; and
    entirely removing the nitride film.

2. The manufacturing method of the epitaxial silicon wafer according to claim 1, further comprising removing a native oxide on the surface of the epitaxial film before the nitride film is formed,
    wherein the setting of the nitrogen concentration is conducted on the silicon wafer after removing the native oxide.

3. The manufacturing method of the epitaxial silicon wafer according to claim 2, wherein the native oxide is removed by subjecting the silicon wafer to a heat treatment in one of an argon atmosphere, an ammonia atmosphere, and a hydrogen atmosphere by using the same heat treatment equipment as used in the setting of the nitrogen concentration.

4. The manufacturing method of the epitaxial silicon wafer according to claim 1, further comprising forming a strain layer on the surface of the epitaxial film exposed after the entirely removing of the nitride film, the strain layer causing a film stress ranging from 10 MPa to 1000 MPa.

5. The manufacturing method of an epitaxial silicon wafer according to claim 1, wherein in the setting of the nitrogen concentration, the heat treatment is conducted so that:
    a temperature X is in a range from 850° C. to 1400° C.,
    a heat treatment time Y is 1 second or more, and
    formula (1) below is satisfied:

$$Y\geq1\times10^{34}\exp(-0.084X) \qquad (1).$$

* * * * *

UNITED STATES PATENT AND TRADEMARK OFFICE
CERTIFICATE OF CORRECTION

PATENT NO. : 11,888,036 B2
APPLICATION NO. : 17/848919
DATED : January 30, 2024
INVENTOR(S) : Kazuya Kodani et al.

It is certified that error appears in the above-identified patent and that said Letters Patent is hereby corrected as shown below:

In the Claims

Column 10, Line 54 (Claim 5), please change "of an" to -- of the --.

Signed and Sealed this
First Day of October, 2024

Katherine Kelly Vidal
*Director of the United States Patent and Trademark Office*